United States Patent
Hwang et al.

(10) Patent No.: US 9,035,341 B2
(45) Date of Patent: May 19, 2015

(54) SEMICONDUCTOR LIGHT EMITTING DEVICE WITH WIRING UNIT ARRANGEMENT

(71) Applicant: SAMSUNG ELECTRONICS CO., LTD., Gyeonggi-do (KR)

(72) Inventors: Hae Youn Hwang, Gyeonggi-do (KR); Pun Jae Choi, Gyeonggi-do (KR); Jung Jae Lee, Gyeonggi-do (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 13/844,783

(22) Filed: Mar. 15, 2013

(65) Prior Publication Data

US 2013/0256712 A1    Oct. 3, 2013

(30) Foreign Application Priority Data

Mar. 27, 2012  (KR) ................. 10-2012-0030950

(51) Int. Cl.
*H01L 33/00* (2010.01)
*H01L 27/15* (2006.01)
*H01L 33/38* (2010.01)
*H01L 33/44* (2010.01)

(52) U.S. Cl.
CPC .............. *H01L 27/156* (2013.01); *H01L 33/38* (2013.01); *H01L 33/44* (2013.01)

(58) Field of Classification Search
USPC ............................... 257/98, 99, 100
See application file for complete search history.

(56) References Cited

U.S. PATENT DOCUMENTS

| | | | |
|---|---|---|---|
| 6,472,718 B2 * | 10/2002 | Lell | 257/446 |
| 7,221,044 B2 * | 5/2007 | Fan et al. | 257/676 |
| 2007/0278502 A1 * | 12/2007 | Shakuda et al. | 257/88 |
| 2010/0047943 A1 * | 2/2010 | Lee et al. | 438/28 |
| 2011/0278600 A1 * | 11/2011 | Lin et al. | 257/88 |

FOREIGN PATENT DOCUMENTS

| | | |
|---|---|---|
| JP | 2001-257380 A | 9/2001 |
| JP | 2009-289965 A | 12/2009 |
| KR | 2008-0002161 A | 1/2008 |
| KR | 10-1055766 A | 6/2011 |
| KR | 2011-0095772 A | 8/2011 |

* cited by examiner

Primary Examiner — Bilkis Jahan
(74) Attorney, Agent, or Firm — McDermott Will & Emery LLP (57) ABSTRACT

A semiconductor light emitting device includes a substrate, a semiconductor laminate disposed on the substrate and divided to a plurality of light emitting cells with an isolation region, and a wiring unit electrically connecting the plurality of light emitting cells. A region of lateral surfaces of each of the light emitting cells in which the wiring unit is disposed has a slope gentler than slopes of other regions of the lateral surfaces of each of the light emitting cells.

10 Claims, 9 Drawing Sheets

PRIOR ART

SEMICONDUCTOR LIGHT EMITTING DEVICE WITH WIRING UNIT ARRANGEMENT

CROSS-REFERENCE TO RELATED APPLICATION

This application claims benefit of priority to Korean Patent Application No. 10-2012-0030950 filed on Mar. 27, 2012, in the Korean Intellectual Property Office, the entire contents of which are hereby incorporated by reference.

TECHNICAL FIELD

The present inventive concept relates to a semiconductor light emitting device and, more particularly, to a semiconductor light emitting device having a structure, in which a plurality of light emitting cells are arranged, a light emitting module, and an illumination apparatus.

BACKGROUND

In general, a semiconductor light emitting device, having advantages as a light source in terms of output, efficiency, and reliability, has been actively studied and developed as a high output, high efficiency light source that may be used in a backlight of a display device or in various illumination devices.

In order to use an LED as an illuminating light source commercially, an LED may be required to have high luminance efficiency and incur low fabrication costs, while providing a desired high level of output. However, if a rated current is increased to obtain a high luminous flux in an LED chip having the same area of a high output LED, a current density may also be increased, thereby degrading luminance efficiency and heating the device. The degradation of luminance efficiency may be accelerated due to the heating of the device.

Meanwhile, in order to alleviate the problem of current density, a method of increasing the area of an LED chip may be considered. But, in this case, it may be difficult to implement a uniform current density across the entire area of the chip and a high production yield may be difficult to obtain.

Thus, as a solution to the problem, a method of implementing an epitaxial layer, for an LED grown on a single substrate, into a plurality of LED cells through an isolation process and connecting the plurality of LED cells may be taken into consideration. Here, during the isolation process, sloped surfaces of the respective LED cells are required to be sufficiently gentle for a metal for connecting the plurality of LED cells to be easily deposited thereon. In this case, however, since a large region of the epitaxial layer may be removed during the isolation process, an effective light emitting area (i.e., the area of an active layer) may be drastically reduced.

Therefore, a multi-cell semiconductor light emitting device having enhanced luminance efficiency by minimizing a reduction in an effective light emitting area through an isolation process, and a fabrication method and application product thereof are required.

SUMMARY

An aspect of the present inventive concept relates to a semiconductor light emitting device including a substrate, a semiconductor laminate and a wiring unit. The semiconductor laminate is disposed on the substrate and divided to a plurality of light emitting cells with an isolation region. The wiring unit electrically connects the plurality of light emitting cells. A region of lateral surfaces of each of the light emitting cells in which the wiring unit is disposed has a slope gentler than slopes of other regions of the lateral surfaces of each of the light emitting cells.

The plurality of light emitting cells may have a plurality of lateral surfaces, respectively. The region in which the wiring unit is disposed may be a portion of at least one lateral surface of the light emitting cells.

The region in which the wiring unit is disposed may have a recess portion having a sloped surface gentler than a sloped surface of other regions of the lateral surfaces of each of the light emitting cells.

A slope angle of the lateral surface in the region in which the wiring unit is disposed may be less than a slope angle of a lateral surface in lateral surface regions of the light emitting cells different than the lateral surface in the region in which the wiring unit is disposed, by about 10° or more.

A slope angle of the lateral surface in the region in which the wiring unit is disposed may range from 40° to 60°. A slope angle of the lateral surface in other lateral surface regions of the light emitting cells may be 70° or more.

The semiconductor laminate may include first and second conductivity-type semiconductor layers and an active layer positioned therebetween.

The plurality of light emitting cells may include first and second contacts connected to the first and second conductivity-type semiconductor layers, respectively, The semiconductor light emitting device may further include first and second bonding pads. The wiring unit may include sub-connection wirings connected to either of the first and second contacts of the light emitting cells and a main connection wiring connecting the sub-connection wirings and the first and second bonding pads.

The plurality of light emitting cells may include a plurality of first and second contacts, respectively.

An irregular portion may be defined on a lower surface of the isolation region.

An insulating layer may be disposed on a lateral surface of each of the light emitting cells to prevent an electrical connection between the wiring unit and a region of undesired electrical contact of each of the light emitting cells.

Another aspect of the present inventive concept encompasses a method of fabricating a semiconductor light emitting device including forming a semiconductor laminate on a substrate. An isolation region is formed to divide the semiconductor laminate into a plurality of light emitting cells. A wiring region is formed on a portion of a lateral surface of each of the light emitting cells such that the wiring region has a slope gentler than slopes of other lateral surfaces of each of the light emitting cells. A wiring unit is formed such that at least a portion thereof is positioned in the wiring region, the wiring unit electrically connecting the plurality of light emitting cells.

The forming of the isolation region and the forming of the wiring region on the portion of the lateral surface of each of the light emitting cells may be performed as a single process.

The single process may be performed by using a photoresist process. A mask used in the photoresist process may have a pattern allowing an amount of light exposure to be gradually changed in the wiring region.

The plurality of light emitting cells may have a plurality of lateral surfaces, respectively, and the wiring region may be a portion of at least one lateral surface of the light emitting cells.

The wiring region may have a recess portion defined to have a sloped surface gentler than a sloped surface of other regions.

A slope angle of the lateral surface in the wiring region may be less than that of a lateral surface in different lateral surface regions of the light emitting cells by about 10° or more.

A slope angle of the lateral surface in the wiring region may range from 40° to 60°. A slope angle of the lateral surface in other lateral surface regions of the light emitting cells may be 70° or more.

The forming of the semiconductor laminate may be sequentially forming a first conductivity-type semiconductor layer, an active layer, and a second conductivity-type semiconductor layer.

The method may further include forming first and second contacts connected to the first and second conductivity-type semiconductor layers, respectively, in each of the plurality of light emitting cells, before the forming of the wiring unit.

A plurality of first and second contacts may be formed in each of the plurality of light emitting cells.

The method may further include defining an irregular portion on a lower surface of the isolation region.

The method may further include: forming an insulating layer on a lateral surface of each of the light emitting cells to prevent an electrical connection with a region of undesired electrical contact of each of the light emitting cells, before the forming of the wiring unit.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness layers and regions may be exaggerated for clarity.

DETAILED DESCRIPTION OF THE PREFERRED EMBODIMENT

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

Figure 1:
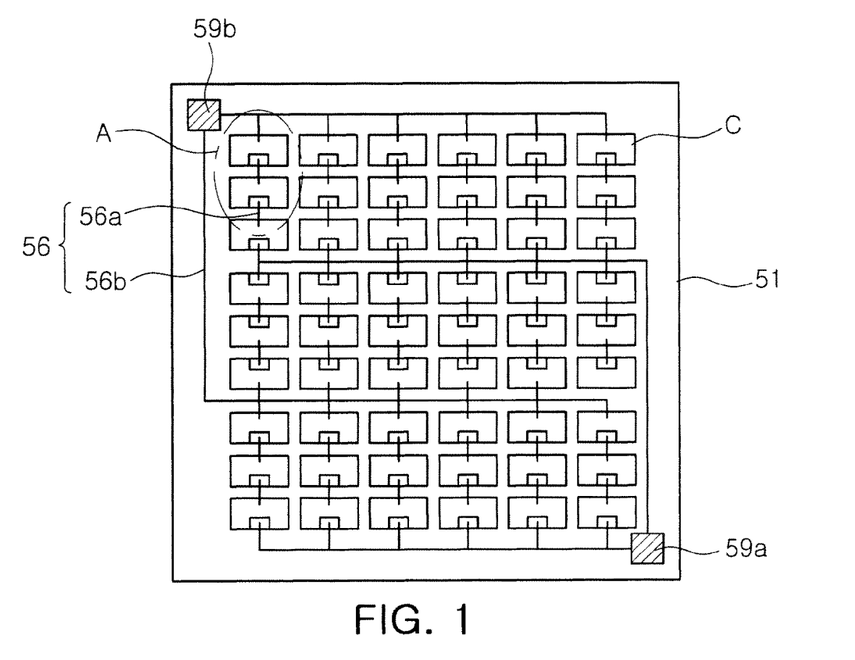
FIG. 1 is a plan view of a semiconductor light emitting device according to an embodiment of the present inventive concept.
Figure 2:
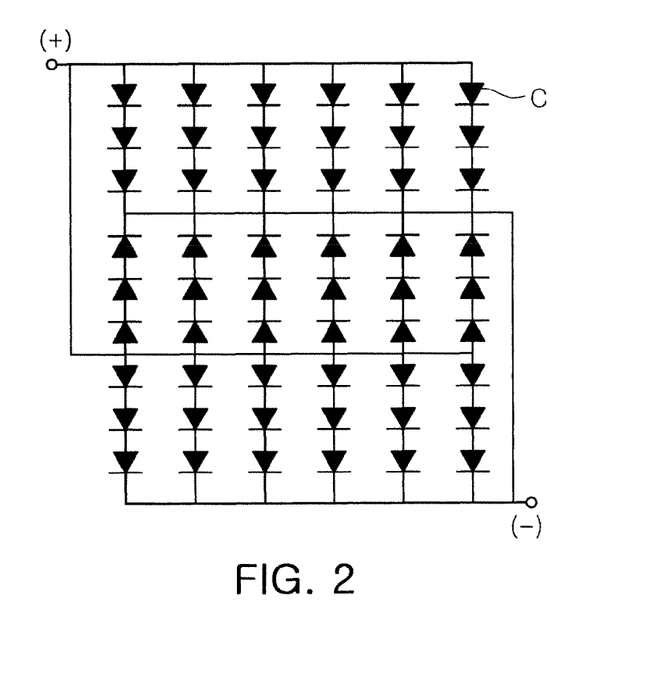
FIG. 2 is an equivalent circuit diagram of the semiconductor light emitting device illustrated in FIG. 1.

FIG. 1 is a plan view of a semiconductor light emitting device according to an embodiment of the present inventive concept. FIG. 2 is an equivalent circuit diagram of the semiconductor light emitting device illustrated in FIG. 1.

As shown in FIG. 1, a semiconductor light emitting device 50 according to an embodiment of the present inventive concept includes a substrate 51 and a plurality of light emitting cells C formed on an upper surface of the substrate 51.

Figure 4:
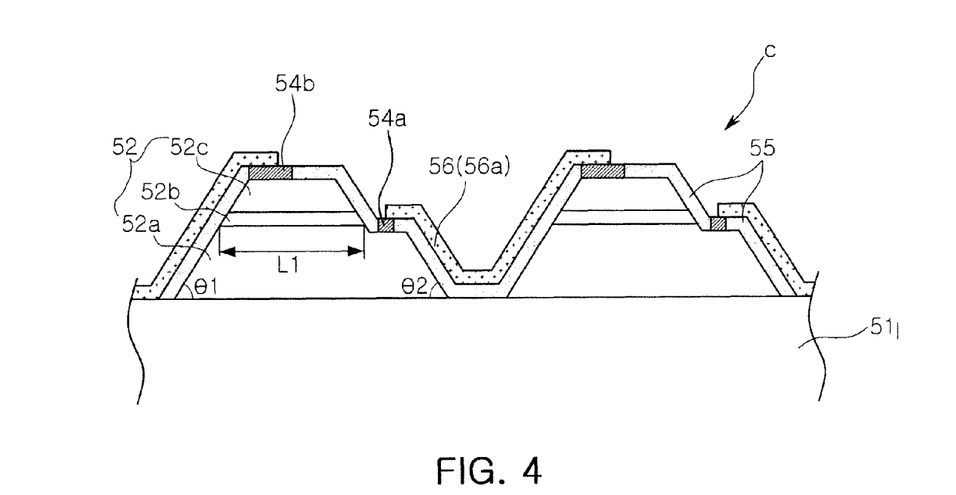
FIG. 4 is a cross-sectional view taken along line X1-X1' in FIG. 3.
Figure 5:
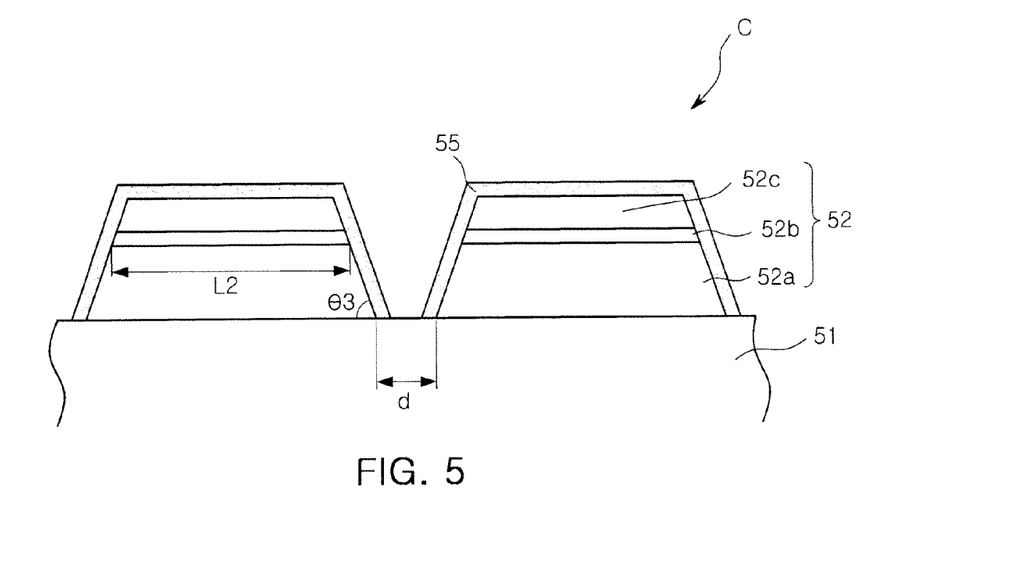
FIG. 5 is a cross-sectional view taken along line X2-X2' in FIG. 3.

The plurality of light emitting cells C may be arranged in a 6×9 grid pattern, and as shown in FIGS. 4 and 5, the plurality of light emitting cells C may be obtained by separating semiconductor laminates (or semiconductor lamination bodies) 52 including a first conductivity-type semiconductor layer 52a, an active layer 52b, and a second conductivity-type semiconductor layer 52c sequentially formed on an upper surface of the substrate 51.

In an embodiment of the present inventive concept, as shown in the equivalent circuit diagram of FIG. 2, the light emitting cells C may be arranged in six columns. Also, each of the columns may have an array A in which three light emitting cells C are connected in series and groups of the three connected light emitting cells C may be connected in threes. The semiconductor light emitting device 50 has a wiring unit 56 (see FIG. 1) to connect all the three light emitting cells C, which are connected in series, in parallel. The wiring unit 56 is connected to first and second bonding pads 59a and 59b (see FIG. 1).

The wiring unit 56 employed in an embodiment of the present inventive concept may include a sub-connection wiring 56a directly connected to the light emitting cells C and a main connection wiring 56b connecting portions of the sub-connection wiring 56a to the first and second bonding pads 59a and 59b. As shown in FIG. 1, all of three light emitting cells connected in series may be connected in parallel by the wiring unit 56 (see the equivalent circuit diagram of FIG. 2).

The first and second bonding pads 59a and 59b may be formed as a metal/alloy layer such as chromium/gold (Cr/Au) layer, but the present inventive concept is not limited thereto. The wiring unit 56 may be made of a metal such as aluminum (Al) or silver (Ag) having excellent reflectance and conductivity.

The array of the LED cells and the structure of the wiring unit 56 may be variably modified according to a desired voltage standard, an output, or the like. For example, a voltage standard of the semiconductor light emitting device may be obtained by selecting a driving voltage of each of light emitting cells and the number of light emitting cells connected in series. A desired output may be obtained by adjusting a unit output of the light emitting cells and a total number of driven light emitting cells.

In an embodiment of the present inventive concept, the main connection wiring 56b may be formed on an upper surface (e.g., an isolated region) of the substrate 51, so the main connection wiring 56b is formed on a relatively flat (or even) surface. Meanwhile, the sub-connection wiring 56a may be connected over an isolated region to the light emitting cell C. The sub-connection wiring 56a may be formed along an uneven path.

Figure 3:
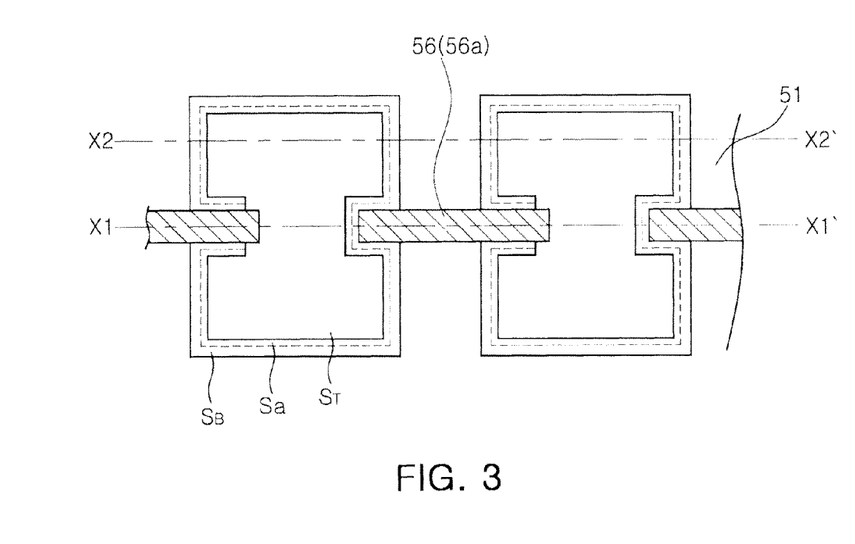
FIG. 3 is an enlarged plan view showing a connection between light emitting cells of the semiconductor light emitting device illustrated in FIG. 1.

In detail, as shown in FIG. 3, the sub-connection wiring 56a connects the main connection wiring 56b formed on the substrate 51 and the light emitting cells C, or connects adjacent light emitting cells C by way of the upper surface of the substrate 51, so the sub-connection wiring 56a is formed along a lateral (side) surface of the light emitting cells C.

If the uneven surface has an extreme gradient, it is difficult to perform a wiring deposition process or a defect such as a disconnection, or the like, may be easily generated. In an embodiment of the present inventive concept, the region of the lateral surface of the light emitting cells C in which the sub-connection wiring 56a is formed, may be formed to have a gentle slope. This will be described in detail with reference to FIGS. 3 through 5.

FIG. 4 is a cross-sectional view taken along line X1-X1' in FIG. 3 (a wiring formation region). FIG. 5 is a cross-sectional view taken along line X2-X2' in FIG. 3.

With reference to FIGS. 4 and 5, the light emitting cell C employed in an embodiment of the present inventive concept may include first and second contacts 54a and 54b connected to first and second conductivity-type semiconductor layers 52a and 52c, respectively, and an insulating layer 55 formed on a lateral (side) surface of the light emitting cell C. The insulating layer 55 may prevent an electrical connection between the sub-connection wiring 56a and a region of undesired electrical contact of the light emitting cell C.

In comparing the structures illustrated in FIGS. 4 and 5, it can be seen that the region of FIG. 4, on which the sub-connection wiring 56a is formed, is sloped to be gentler than a different lateral (side) surface region (see FIG. 5).

The gradient may be expressed as a slope angle between the sloped regions and the upper surface of the substrate 51.

In an embodiment of the present inventive concept, as shown in FIG. 4, the wiring formation region may be divided into a lateral (side) surface region adjacent to the second contact 54b and a lateral (side) surface region adjacent to the first contact 54a formed in a mesa-etched portion. The respective lateral (side) surface regions have relatively gentle slope angles $\theta 1$ and $\theta 2$ such that a smooth wiring deposition process is guaranteed and a defect such as a disconnection, or the like, is reduced. Here, the two slope angles $\theta 1$ and $\theta 2$ may be different, or may be set to be identical as necessary.

Meanwhile, as shown in FIG. 5, at least a portion of the other lateral (side) surface regions of the light emitting cell C, excluding the wiring formation region (e.g., the wiring formation region shown in FIG. 4), has a slope angle $\theta 3$ greater than the slope angles $\theta 1$ and $\theta 2$ of the wiring formation region. The entire lateral (side) surface region, excluding the wiring formation region, may have the slope angle $\theta 3$ greater than the slope angles $\theta 1$ and $\theta 2$ of the wiring formation region. The steep slope angle $\theta 3$ at the lateral (side) surface region of the light emitting cell C, excluding the wiring formation region, may guarantee a relatively large effective light emission area.

In brief, in a comparison between the active layers 52b appearing in the sections of the light emitting cells illustrated in FIGS. 4 and 5, respectively, it can be seen that a length L2 of the active layer 52b appearing in the region different from the wiring formation region is greater than a length L1 of the active layer 52b appearing on the section of the wiring formation region.

In this manner, of the lateral (side) surfaces of the light emitting cell C, the wiring formation region is selectively implemented to have a gentle slope while the other regions have a steep slope angle as possible, thereby sufficiently securing an effective light emission area. This will be described in more detail with reference to FIGS. 3 and 6.

First, FIG. 3 is a plan view of light emitting cells C connected by the sub-connection wiring 56a. Here, $S_T$ and $S_B$ indicate areas of an upper surface and a bottom surface of the light emitting cell C, respectively, and $S_a$ indicates an area of the active layer 52b.

As described above, etching is additionally performed to have a gentle slope angle in a region in which the sub-connection wiring 56a is formed. In this etching process, an appropriate slope condition for forming a wiring can be obtained but a portion of the active layer is inevitably removed.

In consideration of this, an embodiment of the present inventive concept provides a method of reducing a removal area of the active layer 52b by limiting a gentle slope surface to the wiring formation region and forming the other lateral surface regions to have a relatively great slope angle $\theta 3$.

Figure 6:
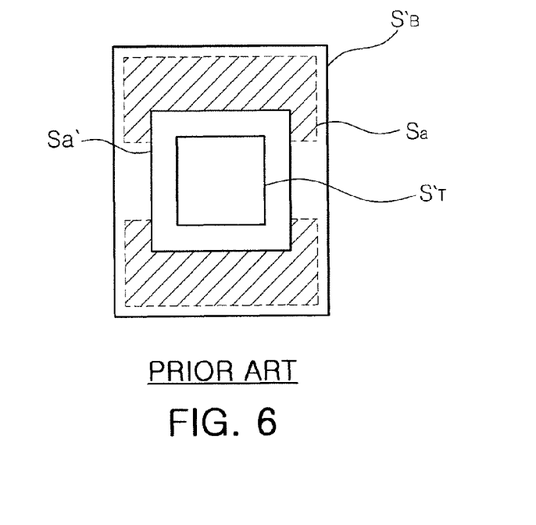
FIG. 6 is a plan view showing an example of a light emitting cell according to a related art.

FIG. 6 is a plan view of a cell in which the entire lateral surfaces are formed to have a gentle slope angle according to a comparative example, in comparison to embodiments of the present inventive concept. Here, $S'_T$ and $S'_B$ are areas of upper and bottom surfaces of the light emitting cell, respectively. $S'_a$ is an area of the active layer of the light emitting cell, of which all the lateral surfaces are to be processed to have a gentle sloped surface required for a wiring process. It can be seen that, if only the wiring formation area of the active layer area $S'_a$ according to the comparative example is selectively processed in a manner similar to that shown in FIG. 3, the lower surface of an area $S_a$ of the active layer, which corresponds to the active layer of embodiments of the present inventive concept, would be considerably larger compared to the active layer area $S'_a$.

Thus, according to an embodiment of the present inventive concept, the wiring formation region is implemented to have a gentle slope to thus minimize defective wiring, while the other regions are implemented to have a relatively great slope angle to thus provide an active layer area greater than the area in a configuration, for example, as shown in FIG. 5, in which the entire lateral surfaces of the light emitting cell are processed to have a gentle slope required for a wiring process.

The slope angles $\theta 1$ and $\theta 2$ at the lateral surfaces of the region in which the wiring unit 56 is formed (see FIG. 4) may be less than the slope angle $\theta 3$ at the other lateral surface regions (see FIG. 5) of the light emitting cell C by about 10° or more. For example, the sloped angles $\theta 1$ and $\theta 2$ at the lateral surfaces of the region in which the wiring unit 56 is formed may range from 40° to 60°, and the slope angle $\theta 3$ at the lateral surface of the other lateral surface region of the light emitting cell C may be 70° or more, including an ideally vertical angle.

In an embodiment of the present inventive concept, the portion of the wiring formation region additionally etched to have a gentle slope has a recessed shape (for example, see FIG. 4) in comparison to the other regions which are not additionally etched, so the wiring formation region may be understood as a 'recessed portion' in actuality.

The present inventive concept may be implemented in various embodiments including any other characteristics elements as well as the arrangement of the light emitting cells. A further embodiment of the present inventive concept is illustrated in FIG. 7.

Figure 7:
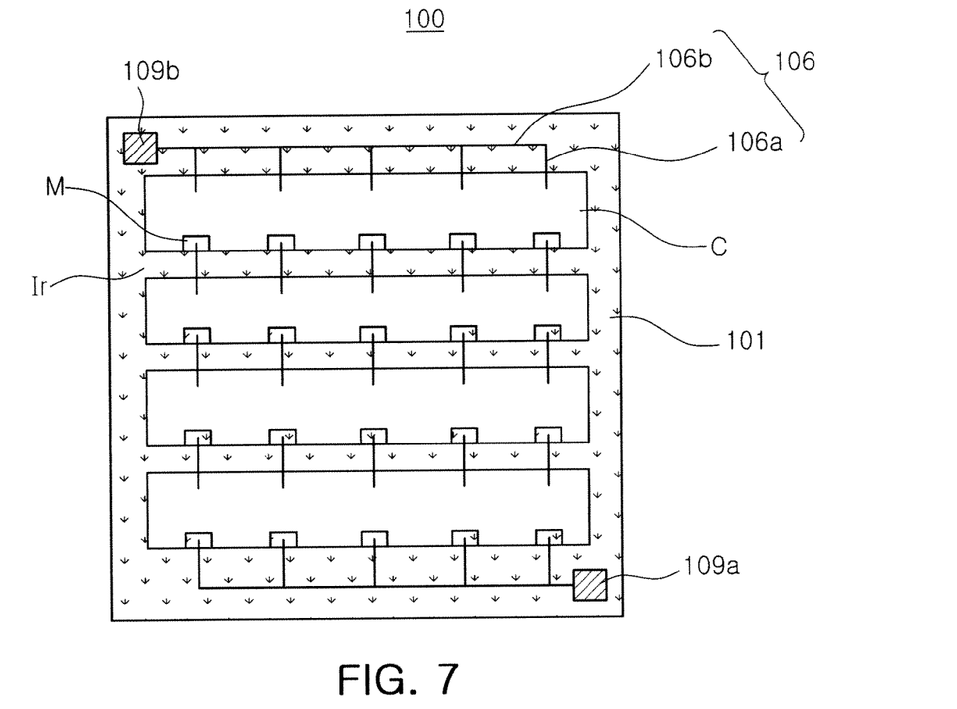
FIG. 7 is a plan view of a semiconductor light emitting device according to another embodiment of the present inventive concept.

A semiconductor light emitting device 100 illustrated in FIG. 7 includes a substrate 101 and four light emitting cells C arranged in a vertical direction on an upper surface of the substrate 101.

Similar to the above-described embodiments of the present inventive concept, the light emitting cells employed in an embodiment of the present inventive concept may include a semiconductor laminate having a first conductivity-type semiconductor layer, an active layer, and a second conductivity-type semiconductor layer sequentially formed on the upper surface of the substrate 101. Here, unlike the light emitting cells illustrated in FIG. 1, the light emitting cells C illustrated in FIG. 7 have a structure including five first and second contacts, respectively.

In this manner, various types of light emitting cells may be used in the present inventive concept. For example, as shown in FIG. 1, a single light emitting cell physically discriminated in an isolation region includes a single first contact and a single second contact and may be driven as a single light emitting element when actually driven. As another type of light emitting cells according to an embodiment of the present inventive concept, as shown in FIG. 7, the single physically discriminated light emitting cell may include a plurality of first and second contacts provided at regular intervals and driven like a plurality of actual light emitting elements.

Figure 8:
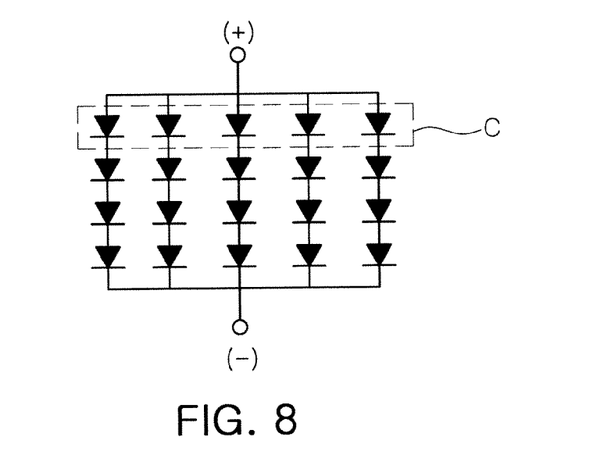
FIG. 8 is an equivalent circuit diagram of the semiconductor light emitting device illustrated in FIG. 7.

As a result, although it is configured such that four physically separated light emitting cells are connected in series, but they act as five light emitting elements in the same light emitting cells due to five contacts disposed at regular intervals, and the driving circuit may be understood as an array of 5×4 as shown in FIG. 8.

A wiring unit 106 (see FIG. 7) employed in an embodiment of the present inventive concept may include sub-connection wirings 106a directly connected to the light emitting cell C, and a main connection wiring 106b connected to portions of the sub-connection wirings 106a and first and second bonding pads 109a and 109b.

Similar to the foregoing embodiments of the present inventive concept, a wiring formation region of the lateral surface of the light emitting cell C in which the sub-connection wirings 106a are formed has a relatively gentle slope angle sufficient to guarantee a smooth wiring deposition process and to reduce a defect such as disconnection, or the like. Meanwhile, at least a portion of the other lateral surface region, excluding the wiring formation region, has a slope angle greater than a slope angle of the wiring formation region.

In this manner, the steep slope angle of the lateral surface region of the light emitting cell C, excluding the wiring formation region, can guarantee a relatively large effective light emission area.

Meanwhile, in an embodiment of the present inventive concept, a plurality of irregularities (or depressions or protrusions) Ir are formed on the upper surface of the substrate 101 exposed as isolation. Through the irregularities, light extraction efficiency can be improved.

As described above, the wiring formation region is implemented to have a gentle slope to minimize a defective wiring, while the other region is implemented to have a relatively great slope angle, thus providing an active layer area greater than the case in which the entire lateral surfaces of the light emitting cell are processed to have a gentle slope required for a wiring process.

The process for employing the selectively gentle slope structure in the wiring formation region may be implemented apart from an existing isolation process and/or mesa-etching process, but these sequential processes may be more easily implemented through a single photoresist process.

For example, a mask used in a photoresist process may be modified such that a quantity of light is gradually adjusted, thus implementing a desired gradient selectively in a wiring formation region. A mask illustrated in FIG. 9 is an example that may be employed in the present fabrication method.

Figure 9:
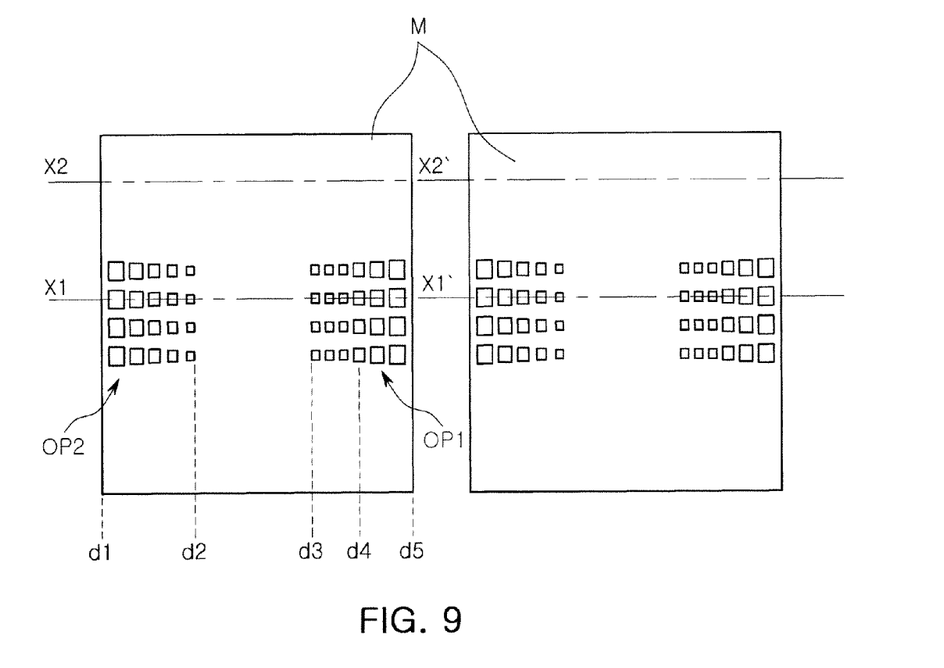
FIG. 9 is a plan view showing an example of a mask that may be employed in a method of fabricating a semiconductor light emitting device according to an embodiment of the present inventive concept.

The mask M illustrated in FIG. 9 is used for a positive photoresist process, and a sloped surface formation process with respect to a wiring formation region may be performed together with an isolation process and a mesa-etching process.

A region between the masks M is an isolation region separating light emitting cells, which is completely exposed. Light exposure is blocked in a light emitting cell region unrelated to a wiring formation region and a mesa-etching region, like a region indicated by X2-X2' (see FIG. 9).

Meanwhile, in the wiring formation region together with the mesa-etching region, a desired photoresist pattern may be formed by adjusting a desired amount of light exposure by using first and second open patterns OP1 and OP2.

The desired amount of light exposure may be appropriately adjusted by using the size and number of the open patterns. For example, a sloped surface in the wiring formation region may be implemented by employing a pattern in which an amount of light exposure is gradually changed.

In this example, the first open pattern OP1 is used to form a mesa etching region and a sloped surface for a wiring to be provided to the region. The second open pattern OP2 is used to form a sloped surface for a wiring to be connected to a second contact.

Figure 10:
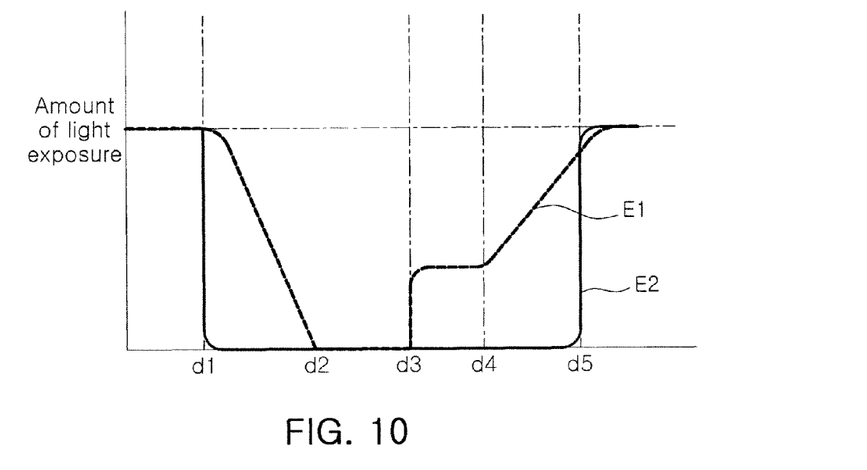
FIG. 10 is a graph showing an exposure distribution by the mask illustrated in FIG. 9.

As indicated by a curve E1 in FIG. 10, an amount of light exposure according to the first open pattern OP1 is constant in regions (d3-d4) in which a first contact is to be formed, and is gradually increased toward the edges of the light emitting cell (d4-d5), while an amount of light exposure according to the second open pattern OP2 is gradually increased toward the edges of the of the light emitting cell (d2-d1).

Figure 11:
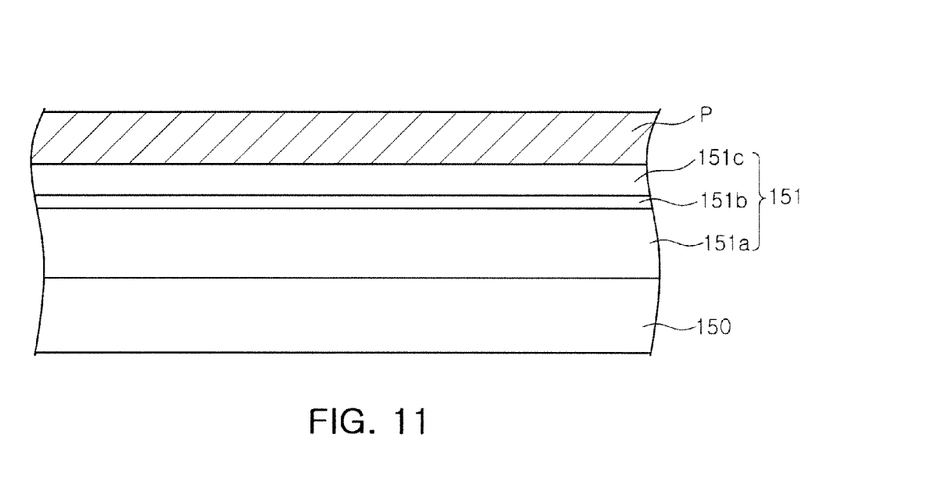
FIGS. 11 through 13 are cross-sectional views showing processes of patterning photoresist that can be employed in a method of fabricating a semiconductor light emitting device according to an embodiment of the present inventive concept.
Figure 12:
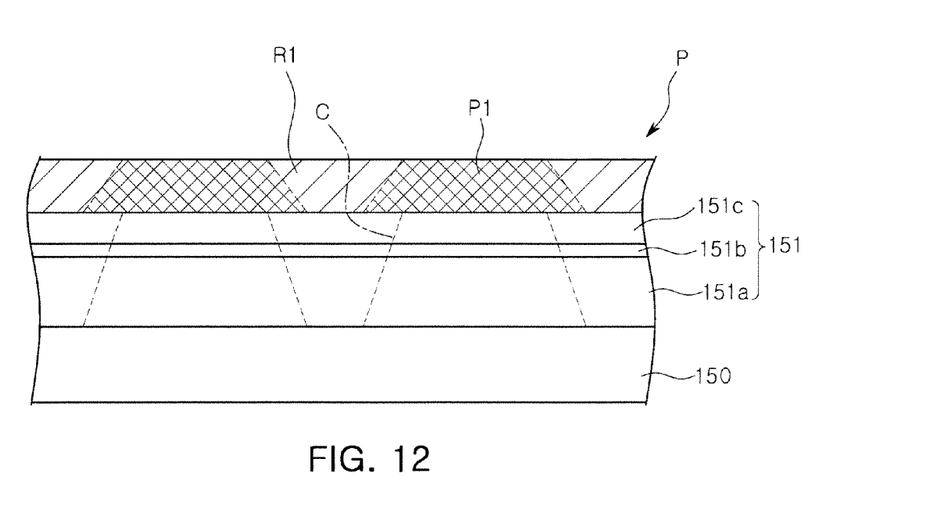
Figure 13:
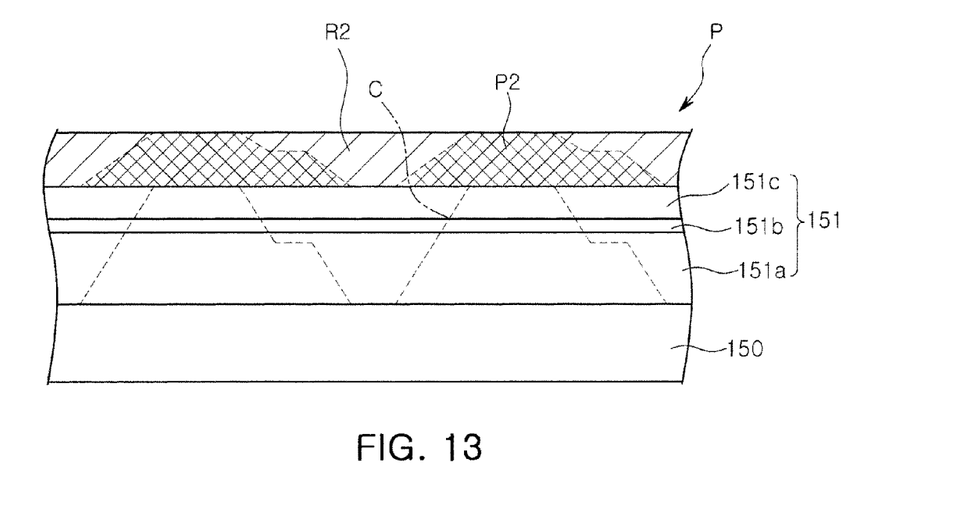

A process of forming a photoresist pattern to be used for an etching process by using the masks M is illustrated in FIGS. 11 through 13.

As shown in FIG. 11, a first conductivity-type semiconductor layer 151a, an active layer 151b, and a second conductive semiconductor layer 151c are sequentially grown on the substrate 150 to form a semiconductor laminate (or a semiconductor lamination body) 151 for a plurality of light emitting cells, and a photoresist layer P is formed on the semiconductor laminate 151.

Subsequently, the photoresist P is exposed by using the masks M illustrated in FIG. 9. As described above, the portion taken along line X1-X1' and the portion taken along line X2-X2' are exposed to have different forms and different photoresist patterns are obtained after development.

FIGS. 12 and 13 show contours of photoresist patterns P1 and P2 to be obtained after the portions taken along lines X1-X1' and X2-X2' are exposed and developed, respectively.

As illustrated in FIG. 12, the photoresist pattern P1 actually obtained after removing an exposed region R1 provides a relatively steep sloped surface although a slightly sloped surface due to exposure inevitably generated on the edges of the mask.

In comparison, as illustrated in FIG. 13, the photoresist pattern P2 actually obtained after removing an exposed region R2 may provide a gentle sloped surface advantageous for a wiring deposition process, as well as a mesa etching region, due to a gradual adjustment of light exposure.

The photoresist patterns defined by the sections illustrated in FIGS. 12 and 13 can be obtained through an appropriate developing process after the exposure process. Subsequently, the light emitting cell having a shape of "C" indicated in FIGS. 12 and 13 may be obtained through an etching process such as an inductively coupled plasma (ICP) dry etching using the three-dimensionally obtained photoresist patterns.

In this manner, the process of forming a light emitting cell such that the lateral surface regions have selectively different slope angles may be easily implemented through the photoresist process using a single mask and the etching process.

A multi-chip array semiconductor light emitting device according to various embodiments of the present inventive concept may be advantageously used as a chip in various types of modules including a base having an electrode part such as a printed circuit board (PCB). Also, various light emitting devices and light emitting modules as described above may be implemented as an illumination device including a driving unit.

Figure 14:
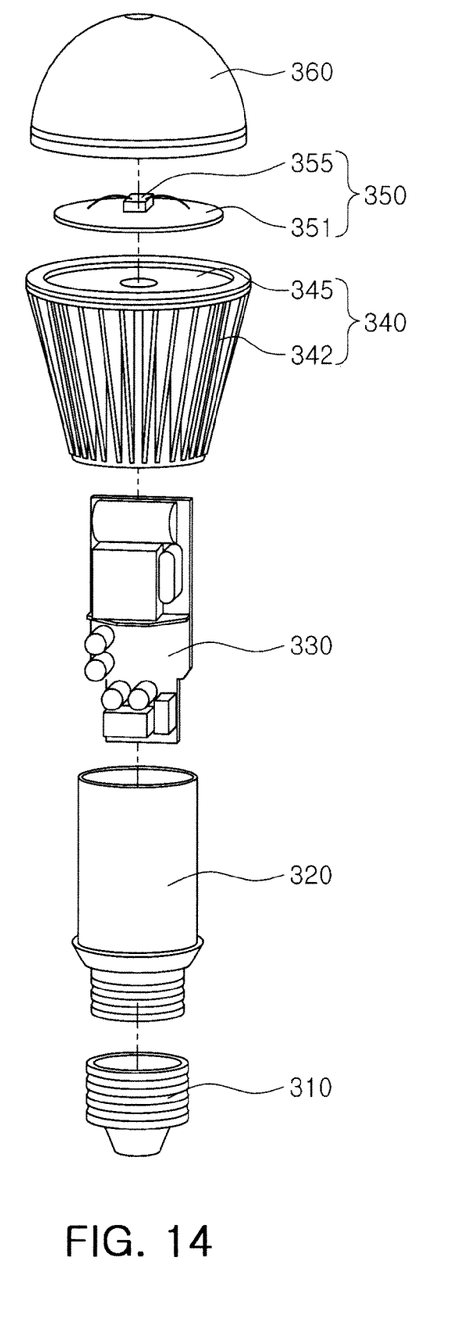
FIGS. 14 and 15 illustrate a bulb type lamp as an example of an illumination device according to an embodiment of the present inventive concept.
Figure 15:
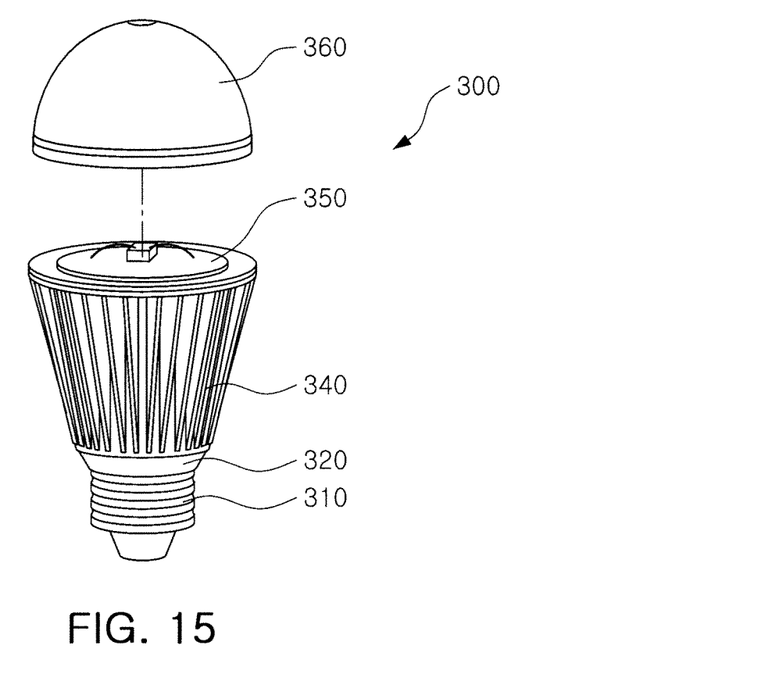

FIGS. 14 and 15 illustrate a bulb type lamp as an example of an illumination device according to an embodiment of the present inventive concept. Specifically, FIG. 14 is an exploded perspective view illustrating each component to facilitate understanding of the configuration of the illumination device. FIG. 15 is a perspective view illustrating an assembled state (excluding a convex lens type cover) of the components of FIG. 14.

With reference to FIGS. 14 and 15, an illumination device 300 includes a light emitting module 350, a driving unit 330, and an external connection unit 310. The illumination device 300 may further include external structures such as external and internal housings 340 and 320 and a cover unit 360.

The light emitting module 350 may have a semiconductor light emitting device 355 as described above, and a circuit board 351 on which the light emitting device 355 is mounted. In an embodiment of the present inventive concept, a single semiconductor light emitting device 355 is illustrated as being mounted on the circuit board 351, but the present inventive concept is not limited thereto and a plurality of semiconductor light emitting devices may be mounted as necessary.

In the illumination device 300 according to an embodiment of the present inventive concept, the light emitting module 350 may include the external housing 340 serving as a heat dissipation unit. The external housing 340 may include a heat dissipation plate 345 directly connected to the light emitting module 350 to enhance a heat dissipation effect. Also, the illumination device 300 may include the cover unit 360 mounted on the light emitting module 350 and having a convex lens shape.

In an embodiment of the present inventive concept, the driving unit 330 may be installed in the internal housing 320 and connected to the external connection unit 310 having a structure such as a socket structure to receive power from an external power source.

Also, the driving unit 330 serves to convert received power into an appropriate current source for driving the semiconductor light emitting device 355 of the light emitting module 350. For example, the driving unit 330 may be configured as an AC-DC converter, a rectifier circuit component, or the like.

In this manner, the foregoing light emitting device and light emitting module may be variably implemented such as indoor illumination devices such as a lamp, or the like, outdoor illumination devices such as a streetlight, an advertising sign, a beacon light, and the like, and illumination devices for means of transportation such as a head lamp, a taillight, or the like, of automobiles, airplanes and ships. Also, the illumination device may additionally include a structure such as a heat dissipation member and/or a reflecting plate, or the like.

As set forth above, according to embodiments of the present inventive concept, since only a region in which a wiring unit is formed is formed to be sloped in comparison to other regions, an effective light emission area (e.g., the active layer) reduced due to an isolation process between cells can be minimized, and thus, luminance efficiency can be enhanced.

In addition, the foregoing technical solutions and effects do not fully enumerate all of the features of the present inventive concept. The foregoing and all other objects, features, aspects and advantages of the present inventive concept will become more apparent from the foregoing detailed description of the present inventive concept when taken in conjunction with the accompanying drawings.

Although a few exemplary embodiments of the present inventive concept have been shown and described, the present inventive concept is not limited to the described exemplary embodiments. Instead, it would be appreciated by those skilled in the art that changes may be made to these exemplary embodiments without departing from the principles and spirit of the inventive concept, the scope of which is defined by the appended claims and their equivalents.

What is claimed is:

1. A semiconductor light emitting device, comprising:
a substrate;
a semiconductor laminate disposed on the substrate and divided to a plurality of light emitting cells with an isolation region, wherein the plurality of light emitting cells include a first conductivity-type semiconductor layer disposed on the substrate, an active layer disposed on the first conductivity-type semiconductor layer and a second conductivity-type semiconductor layer disposed on the active layer; and
a wiring unit electrically connecting the plurality of light emitting cells,
wherein a region of side surfaces of the first conductivity-type semiconductor layer of each of the light emitting cells in which the wiring unit is disposed has a slope gentler than slopes of other regions of the side surfaces of the first conductivity-type semiconductor layer of each of the light emitting cells.

2. The semiconductor light emitting device of claim 1, wherein an irregular portion is defined on a lower surface of the isolation region.

3. The semiconductor light emitting device of claim 1, wherein an insulating layer is disposed on a side surface of each of the light emitting cells to prevent an electrical connection between the wiring unit and a region of undesired electrical contact of each of the light emitting cells.

4. The semiconductor light emitting device of claim 1, wherein the light emitting cells each includes first and second semiconductor layers and active region therebetween, and length of the active region is smaller in the region where the wiring unit is disposed than in other regions where the wiring unit is not disposed.

5. The semiconductor light emitting device of claim 1, wherein:
the first conductivity-type semiconductor layer of the plurality of light emitting cells have a plurality of side surfaces, respectively, and
the region in which the wiring unit is disposed is a portion of at least one side surface of the first conductivity-type semiconductor layer of the light emitting cells.

6. The semiconductor light emitting device of claim 5, wherein the region in which the wiring unit is disposed has a recess portion having a sloped surface gentler than a sloped surface of other regions of the side surfaces of the first conductivity-type semiconductor layer of each of the light emitting cells.

7. The semiconductor light emitting device of claim 1, wherein a slope angle of the side surface in the region in which the wiring unit is disposed is less than a slope angle of a lateral surface in side surface regions of the first conductivity-type semiconductor layer of the light emitting cells different than the side surface in the region in which the wiring unit is not disposed, by about 10° or more.

8. The semiconductor light emitting device of claim 7, wherein:
 a slope angle of the side surface in the region in which the wiring unit is disposed ranges from 40° to 60°, and
 a slope angle of the lateral surface in other side surface regions of the first conductivity-type semiconductor layer of light emitting cells is 70° or more.

9. The semiconductor light emitting device of claim 1, wherein:
 the plurality of light emitting cells include first and second contacts connected to the first and second conductivity-type semiconductor layers, respectively,
 the semiconductor light emitting device further includes first and second bonding pads, and
 the wiring unit includes sub-connection wirings connected to either of the first and second contacts of the light emitting cells and a main connection wiring connecting the sub-connection wirings and the first and second bonding pads.

10. The semiconductor light emitting device of claim 9, wherein the plurality of light emitting cells include a plurality of first and second contacts, respectively.

* * * * *